(12) United States Patent
Kondou et al.

(10) Patent No.: US 7,701,994 B2
(45) Date of Patent: Apr. 20, 2010

(54) NITRIDE SEMICONDUCTOR LIGHT-EMITTING DEVICE AND METHOD FOR FABRICATION THEREOF

(75) Inventors: Masahumi Kondou, Kyoto (JP); Takeshi Kamikawa, Mihara (JP); Yoshinobu Kawaguchi, Ube (JP)

(73) Assignee: Sharp Kabushiki Kaisha, Osaka (JP)

( * ) Notice: Subject to any disclaimer, the term of this patent is extended or adjusted under 35 U.S.C. 154(b) by 85 days.

(21) Appl. No.: 11/311,138

(22) Filed: Dec. 20, 2005

(65) Prior Publication Data

US 2006/0133442 A1 Jun. 22, 2006

(30) Foreign Application Priority Data

Dec. 20, 2004 (JP) .............................. 2004-367005
Oct. 13, 2005 (JP) .............................. 2005-298361

(51) Int. Cl.
*H01S 5/00* (2006.01)
(52) U.S. Cl. ................ 372/49.01; 372/44.01; 372/43.01
(58) Field of Classification Search ............. 372/49.01, 372/44.01, 43.01
See application file for complete search history.

(56) References Cited

U.S. PATENT DOCUMENTS

| 4,317,086 | A | 2/1982 | Scifres et al. | |
|---|---|---|---|---|
| 5,742,628 | A * | 4/1998 | Fujii | 372/45.01 |
| 6,379,985 | B1 * | 4/2002 | Cervantes et al. | 438/33 |
| 6,803,605 | B2 * | 10/2004 | Lindstrom et al. | 257/94 |
| 7,129,163 | B2 * | 10/2006 | Sherrer et al. | 438/637 |
| 2002/0024981 | A1 | 2/2002 | Tojo et al. | |
| 2002/0030200 | A1 * | 3/2002 | Yamaguchi et al. | 257/184 |
| 2002/0141469 | A1 * | 10/2002 | Yamasaki et al. | 372/46 |
| 2003/0186088 | A1 * | 10/2003 | Kato et al. | 428/698 |
| 2004/0238810 | A1 | 12/2004 | Dwilinski et al. | |
| 2005/0127383 | A1 | 6/2005 | Kikawa et al. | |
| 2007/0246720 | A1 | 10/2007 | Kamikawa et al. | |

FOREIGN PATENT DOCUMENTS

| JP | 09162496 | 6/1997 |
|---|---|---|
| JP | 09283843 | 10/1997 |
| JP | 2002-100830 | 4/2002 |
| JP | 2002-335053 | 11/2002 |
| JP | 2003-060298 | 2/2003 |
| JP | 2004-335559 | 11/2004 |
| JP | 2005-101536 | 4/2005 |
| JP | 2005-175111 A | 6/2005 |

OTHER PUBLICATIONS

Office Action for co-pending U.S. Appl. No. 11/638,581, filed Apr. 9, 2008.

(Continued)

*Primary Examiner*—Minsun Harvey
*Assistant Examiner*—Kinam Park
(74) *Attorney, Agent, or Firm*—Harness, Dickey & Pierce, P.L.C.

(57) ABSTRACT

An adhesion layer of a hexagonal crystal is laid on a facet an optical resonator of a nitride semiconductor laser bar having a nitride-based III-V group compound semiconductor layer, and a facet coat is laid on the adhesion layer. In this way, a structure in which the facet coat is laid on the adhesion layer is obtained.

13 Claims, 4 Drawing Sheets

OTHER PUBLICATIONS

Shingo Masui et al., "First-Order AlInGaN 405 nm Distributed Feedback Laser Diodes by Current Injection," Jpn. J. Appl. Phys. 45 (2006) (pp. L749-L751).

Shin-ichi Nagahama et al., "Wavelength Dependence of InGaN Laser Diode Characteristics," Jpn. J. Appl. Phys. 40 (2001) (pp. 3075-3081).

Masashi Kubota et al., "Continuous-Wave Operation of Blue Laser Diodes Based on Nonpolar *m*-Plane Gallium Nitride," Appl. Phys. Express 1 (2008) (p. 011102-1-011102-3).

Shuji Nakamura et al., "InGaN/GaN/AlGaN-Based Laser Diodes with Cleaved Facets Grown on GaN Substrates," Appl. Phys. Lett. 73 (Aug. 10, 1998) (6) (pp. 832-834).

Statement of relevance and partial English translation of JP 2005-101536.

* cited by examiner

NITRIDE SEMICONDUCTOR LIGHT-EMITTING DEVICE AND METHOD FOR FABRICATION THEREOF

This nonprovisional application claims priority under 35 U.S.C. §119(a) on Patent Applications Nos. 2004-367005 filed in Japan on Dec. 20, 2004 and 2005-298361 filed in Japan on Oct. 13, 2005, respectively, the entire contents of which are hereby incorporated by reference.

BACKGROUND OF THE INVENTION

1. Field of the Invention

The present invention relates to a nitride semiconductor light-emitting device having a nitride-based III-V group compound semiconductor layer and a facet coat formed at a facet of an optical resonator.

2. Description of Related Art

In recent years, increasingly high capacities and hence increasingly high densities have been sought in optical disks. Accordingly, standards on BDs (Blu-ray discs) and HD-DVDs (high definition DVDs) using a blue semiconductor laser have been worked out, and products such as decoders therefor have been developed. Demands have been made for reliable high-output blue semiconductor lasers to achieve data writing to such novel disks at increasingly high densities (to cope with two-layer disks) at accordingly high speeds.

In conventional AlGaAs- or InGaAlP-based semiconductor lasers that read data from and write data to CDs or DVDs, optical resonator facets are coated with a dielectric film such as $SiO_2$, $Si_3N_4$, or $Al_2O_3$ to prevent them from degrading or being optically damaged. When this method was applied in a blue semiconductor laser, the drive current was observed to suddenly rise. This is the reason that improvement in a coating technique has been sought after.

Japanese Patent Application Laid-Open No. 2002-335053 reveals that one of the causes of degradation of an optical resonator facet is poor adhesion between the optical resonator facet and a facet coat, and hence proposes a method of forming a facet coat at an optical resonator facet with a metal adhesion layer placed therebetween.

However, when a metal film is used as an adhesion layer, a short circuit occurs in a pn junction on the optical resonator facet, leading to greater absorption of light. The nitride semiconductor laser oscillates at a short wavelength and emits high-energy light, and therefore its output facets degrade due to slight absorption of light. This makes it difficult to realize a high output device with an optical output of more than 100 mW. On the other hand, from the viewpoint of preventing a short circuit in the pn junction and absorption of light, the film thickness needs to be so controlled as to be 10 nm or less, further preferably 5 nm or less, still further preferably 2 nm or less. In that case, the difficulty of film thickness control results in lower yields.

SUMMARY OF THE INVENTION

An object of the present invention is to provide a nitride semiconductor light-emitting device that offers high reliability and high production efficiency by using an adhesion layer that, unlike a metal adhesion layer, enhances adhesion between an optical resonator facet and a facet coat without the need of film thickness control for preventing a short circuit in a pn junction and absorption of light.

To achieve the above object, according to one aspect of the present invention, in a nitride semiconductor light-emitting device, an adhesion layer of a hexagonal crystal is formed between a facet of an optical resonator and a facet coat.

Advisably, the adhesion layer is formed anywhere between at least a light output facet of the optical resonator and the facet coat so as to prevent the optical resonator facet from being optically damaged.

Moreover, when the layer thickness of the adhesion layer is 20 nm or less, no cracks appear, whereby it is possible to fabricate a satisfactory film. When AlN, GaN, BN, or the like is formed as an adhesion layer on a cleaved facet of a nitride semiconductor, the film thus formed, although it is closely packed, has a high internal stress. This may cause the film to develop fine cracks, leading to exfoliation thereof. However, such a problem can be avoided by making the adhesion layer extremely thin, as thin as 20 nm or less, preferably 10 nm or less, and then forming the facet coat thereon. Moreover, when the layer thickness of the adhesion layer is less than 1 nm, such a layer may be not thick enough to enhance adhesion. Therefore, it is preferable that the layer thickness of the adhesion layer be 1 nm or more but 20 nm or less.

Moreover, it is possible to suitably use ZnO as the adhesion layer. In this case, it is preferable to use an oxide as the facet coat. The oxide may be either in a single layer of oxide of one element selected from the group of Al, Si, Ti, Hf, Nb, Ta, and Zr, or in multiple layers including a layer of oxide of one element selected from the group of Al, Si, Ti, Hf, Nb, Ta, and Zr.

Moreover, it is possible to suitably use AlN, GaN, or BN as the adhesion layer. In this case, it is preferable to use a nitride as the facet coat. Alternatively, it is preferable to use an oxide as the facet coat, and the oxide may be either in a single layer of oxide of one element selected from the group of Al, Si, Ti, Hf, Nb, Ta, and Zr, or in multiple layers including a layer of oxide of one element selected from the group of Al, Si, Ti, Hf, Nb, Ta, and Zr. In general, a multilayer film of oxide-based material is used as the facet coat of high reflectivity.

As described above, it is preferable to use as the facet coat a compound containing an element common to the material of which the adhesion layer laid thereunder is formed. For example, with the adhesion layer formed of ZnO or the like containing oxygen, an oxide containing Al, Si, Ti, or the like can be used, and, with the adhesion layer formed of AlN, GaN, BN, or the like containing nitrogen, a nitride containing Si or the like can be used. When Al nitride is used as the adhesion layer, any of the oxides containing Al can be used especially suitably as the facet coat. When oxygen is a common element as with ZnO and $Al_2O_3$, interdiffusion of Zn and Al occurs in an interfacial several atoms thick layer, leading to the formation of $Zn_xAl_yO$ ($x<1$, $y<1$, $x+y=1$).

Advisably, the facet coat may be composed either of a single layer of Si nitride, or of multiple layers including a layer of Si nitride and a layer of Si oxide.

Moreover, by using Al nitride as the adhesion layer and Al oxide as the facet coat, the adhesion layer and the facet coat contain a common element Al, and therefore interdiffusion of nitrogen contained in the adhesion layer and oxygen contained in the facet coat occurs in an interface between the adhesion layer and the facet coat. This provides stronger adhesion between the adhesion layer and the facet coat.

Moreover, the adhesion layer may be fabricated by magnetron sputtering, plasma CVD (chemical vapor deposition), or ECR (electron cyclotron resonance) sputtering. In general, a hexagonal crystal is grown at a high temperature of 400° C. or more by MOCVD (metal organic chemical vapor deposition). However, by magnetron sputtering or ECR sputtering, such a hexagonal crystal can be grown at ambient temperature, and, by plasma CVD, it can be grown at a temperature of 200° C. or less. Therefore, it is possible to form the adhesion layer without degradation of an active layer.

According to another aspect of the present invention, a method for fabricating a nitride semiconductor light-emitting device includes the steps of: forming a nitride-based III-V group compound semiconductor layer; forming an optical resonator of the nitride-based III-V group compound semiconductor layer by cleaving the nitride-based III-V group compound semiconductor layer; cleaning a facet of the optical resonator formed by cleavage by using an inert gas; forming, on the cleaned facet of the optical resonator, a layer of aluminum nitride; and forming a facet coat on the surface of the layer of aluminum nitride.

The adhesion layer is extremely thin, and therefore removing moisture or oxide films as much as possible by cleaning with an inert gas from the optical resonator facet on which the adhesion layer is formed enhances adhesion between the adhesion layer and the optical resonator facet, increasing the benefit of using the adhesion layer. It is thus preferable that the adhesion layer be formed after cleaning of the optical resonator facet by ECR sputtering with an inert gas plasma. The same benefit can be obtained by the use of ECR sputtering with a noble gas such as He, Ne, Ar, or Xe, or a nitrogen gas, as long as it is an inert gas plasma. Specifically, the ECR sputtering with an inert gas plasma may be performed in such a way that a sample is subjected to commonly used reverse sputtering, or a facet thereof is exposed to an inert gas plasma. By only exposing the facet to plasma, moisture or oxide films can be removed therefrom. Here, ECR sputtering is described. It should be understood, however, that the same benefit can be obtained by the use of RF plasma, ion beam irradiation, or the like.

DETAILED DESCRIPTION OF PREFERRED EMBODIMENTS

Figure 1:
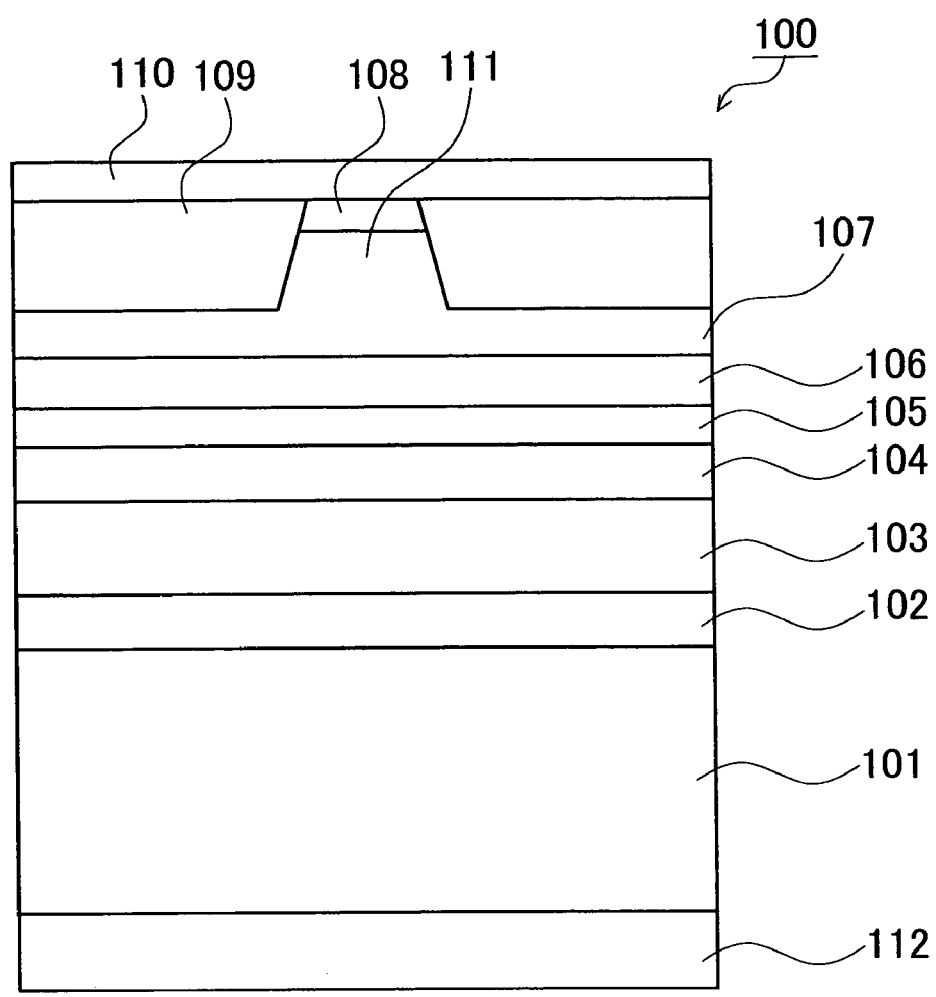
FIG. 1 is a sectional view of the nitride semiconductor laser bar along the direction perpendicular to the optical resonator length.

A nitride semiconductor wafer having a laser structure and an electrode formed thereon is cleaved into bars by scribing with a diamond point and breaking. FIG. 1 is a sectional view of the nitride semiconductor laser bar along the direction perpendicular to the optical resonator length. The nitride semiconductor laser bar 100 has the following layers laid one on top of another in the order mentioned on an n-type GaN substrate 101: an n-AlGaInN buffer layer 102, an n-AlGaInN clad layer 103, an n-AlGaInN guide layer 104, an AlGaInN multiquantum well active layer 105, a p-AlGaInN guide layer 106, a p-AlGaInN clad layer 107, and a p-AlGaInN contact layer 108. Note that the above nitride semiconductor layers may be formed of a nitride-based III-V group compound semiconductor.

It is to be noted that the active layer 105 may contain 0.01 to 10% group V material such as As or P. At least part of the p-AlGaInN guide layer 106, the p-AlGaInN clad layer 107, and the p-AlGaInN contact layer 108 is formed into a stripe-shaped ridge 111 that extends in the direction of the optical resonator. The width of the stripe is of the order of 1.2 to 2.4 μm, typically 1.8 μm.

A p-electrode 110 is so formed as to make contact with the p-AlGaInN contact layer 108, and, under the p-electrode 110, there is formed an insulating film 109 except in a portion corresponding to the ridge 111. As described above, the nitride semiconductor laser bar 100 has a so-called ridge stripe structure. Moreover, the nitride semiconductor laser bar 100 has, on the back face thereof, an n-electrode 112.

Figure 2:
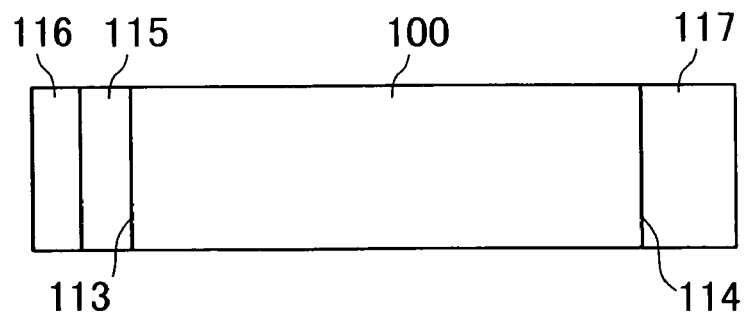
FIG. 2 is a side view of the nitride semiconductor laser bar viewed from the direction lateral to the optical resonator length.

FIG. 2 is a side view of the nitride semiconductor laser bar viewed from the direction lateral to the optical resonator length. An adhesion layer 115 of a hexagonal crystal is laid on an optical resonator facet 113, a facet coat 116 is laid on the surface of the adhesion layer 115, and a facet coat 117 is laid on an optical resonator facet 114. The material of the adhesion layer 115 can be selected from the group of ZnO, AlN, GaN, BN, or the like.

The cleavage surfaces of the nitride semiconductor laser bar 100 are the optical resonator facets 113 and 114. The fabrication method is as follows. The nitride semiconductor laser bar 100 is fixed to a holder, and is then introduced into an ECR sputtering apparatus. The surface of the front optical resonator facet 113 is treated by ECR plasma using Ar so as to remove absorbed moisture and an oxide such as a natural oxidation film from the surface. The surface treatment described above may be performed by using an inert gas such as He, Ne, Kr, or Xe, or a nitrogen gas instead of Ar. In practice, the surface treatment may be performed in two steps. First, the surface treatment using Ar is performed, and then the surface treatment using nitrogen, for example, is performed. Alternatively, the surface treatment may be performed in three steps by using He, Ar, and nitrogen, for example, in this order, or performed in four or more steps. Then, on the surface of the optical resonator facet 113, 10 nm-thick ZnO (the adhesion layer 115) and a single layer of $Al_2O_3$ (the facet coat 116) are laid on top of another in this order by ECR plasma. The thickness of the single layer of $Al_2O_3$ is set at about $3\lambda/4n$ or $\lambda/4n$ ($\lambda$: oscillation wavelength, n: refractive index) so as to give the single layer of $Al_2O_3$ a refractive index of 5%.

Next, the surface of the back optical resonator facet 114 is treated by ECR plasma using Ar so as to remove absorbed moisture and an oxide therefrom. Then, the facet coat 117 is formed on the surface of the optical resonator facet 114 by ECR plasma. The facet coat 117 is a multilayer film composed of eight layers, that is, when a pair of $Al_2O_3/TiO_2$ layers is counted as one period, four periods of them, and the thickness of each layer is set at $\lambda/4n$ so as to give the multilayer film a refractive index of 95%. The multilayer film has $Al_2O_3$ laid as its first layer (on the optical resonator facet 114 side).

Figure 3:
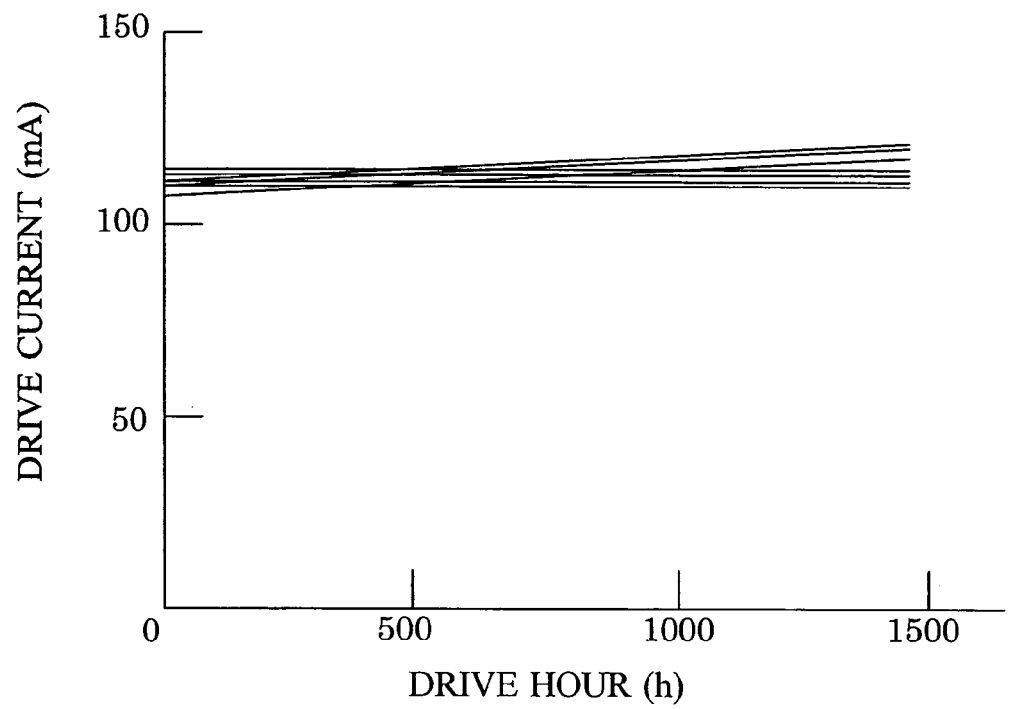
FIG. 3 is a graph showing the results of a life time test of the nitride semiconductor laser device.

The nitride semiconductor laser bar 100 described above was actually split into individual nitride semiconductor laser device chips, which were then packaged and subjected to a life time test. FIG. 3 shows data from the life time test of the nitride semiconductor laser device. The tests were conducted under the following conditions: package temperature, 60° C.; driving, with pulse current such that the peak optical output is constant at 120 mW. FIG. 3 shows the result of measurement conducted for each of seven samples. As shown in FIG. 3, the rate of increase of drive current during current application was decreased, and MTTF (mean time to failure) was predicted to be about 5000 hours (based on the rates of increase of drive current observed at the 500 hours point and 1000 hours point). Moreover, no deterioration in yield due to facet leakage current was observed, and no sudden increase of the drive current during current application was observed.

By contrast, MTTF of the conventional laser device provided with a metal adhesion layer was about 3000 hours, and deterioration in yield due to facet leak current was observed in 5 out of 10 conventional laser devices subjected to the life time test. Here, initial characteristics of the laser devices suffering from the facet leak current are, regardless of aging, already such that their operating currents are high. Moreover, the cause of decreasing MTTF is a phenomenon in which a drive current value suddenly and rapidly increases during driving, and this phenomenon is associated with destructive deterioration of the facet caused by light absorption at the optical resonator facet, or exfoliation or degradation of the film. When the conventional metal layer is used as an adhesion layer, such deterioration occurs because, although the adhesion layer is extremely thin, it absorbs light. According to the present invention, such phenomenon is prevented because there is no absorption of light in the adhesion layer 115, adhesion between the optical resonator facet 113 and the facet coat 116 is good even via the adhesion layer 115, and the quality of the adhesion layer 115 itself is good.

Figure 4:
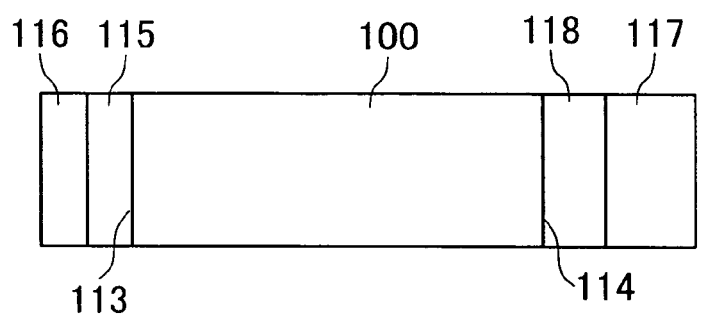
FIG. 4 is a side view of another example of the nitride semiconductor laser bar viewed from the direction lateral to the optical resonator length.

FIG. 4 is a side view of another example of the nitride semiconductor laser bar viewed from the direction lateral to the optical resonator length. The adhesion layer 115 of a hexagonal crystal is laid on the optical resonator facet 113, the facet coat 116 is laid on the surface of the adhesion layer 115, an adhesion layer 118 of a hexagonal crystal is laid on the optical resonator facet 114, and the facet coat 117 is laid on the surface of the adhesion layer 118.

The fabrication method is as follows. The nitride semiconductor laser bar 100 is fixed to a holder, and is then introduced into an ECR sputtering apparatus. The surface of the front optical resonator facet 113 is treated by ECR plasma using Ar so as to remove absorbed moisture and an oxide from the surface. Then, on the surface of the optical resonator facet 113, 20 nm-thick GaN (the adhesion layer 115) and a single layer of $SiO_2$ (the facet coat 116) are laid on top of another in this order by ECR plasma. The thickness of the single layer of $SiO_2$ is set at about $3\lambda/4n$ ($\lambda$: oscillation wavelength, n: refractive index) so as to give the single layer of $SiO_2$ a refractive index of 5%.

Next, the surface of the back optical resonator facet 114 is treated by ECR plasma using Ar so as to remove absorbed moisture and an oxide therefrom. Then, 20 nm-thick GaN (the adhesion layer 118) and the facet coat 117 are formed on the surface of the optical resonator facet 114 by ECR plasma. The facet coat 117 is a multilayer film composed of eight layers, that is, when a pair of $SiO_2/TiO_2$ layers is counted as one period, four periods of them, and the thickness of each layer is set at $\lambda/4n$ so as to give the multilayer film a refractive index of 95%.

The nitride semiconductor laser bar 100 thus fabricated was actually split into individual nitride semiconductor laser device chips, which were then packaged and subjected to a life time test. The tests were conducted under the same conditions as described above (measurement data omitted). Also in this case, no sudden increase of the drive current during current application was observed.

In this embodiment, the adhesion layers 115 and 118 are any hexagonal crystal of a transparent semiconductor such as ZnO, AlN, GaN, or BN. The conventional adhesion layer is a metal layer, and, in this case, the facet coat adheres to the adhesion layer by an intermolecular force that is a weak bonding force. By contrast, by using as the adhesion layers 115 and 118 a hexagonal crystal belonging to the same crystal system as an AlGaInN semiconductor that is a material of the nitride semiconductor layer, the adhesion layers 115 and 118 more strongly adhere to the facet coats 116 and 117 and the optical resonator facets 113 and 114, respectively. This makes it possible to make the facet coats 116 and 117 strongly adhere to the optical resonator facets 113 and 114 even via the adhesion layers 115 and 118, respectively, while preventing current leakage and absorption of light that occurs when a metal layer is used as an adhesion layer.

Through a TEM (transmission electron microscope) observation, it can be confirmed that the adhesion layers 115 and 118 are a hexagonal crystal. Specifically, a TEM image of the adhesion layers 115 and 118 of the present invention shows a hexagonal diffraction pattern. When the adhesion layers 115 and 118 are not hexagonal, for example, when part of the portions where the adhesion layers 115 and 118 make contact with the optical resonator facets 113 and 114, respectively, is amorphous, the adhesion layers 115 and 118 do not sufficiently adhere to the optical resonator facets 113 and 114, leading to exfoliation of the film.

Accordingly, in the present invention, it is essential to make the adhesion layers 115 and 118 hexagonal. However, it is difficult to make these layers hexagonal in a thin film thickness of 20 nm or less only by laying ZnO, AlN, GaN, BN, or the like on the optical resonator facets 113 and 114. An effective way to make these layers hexagonal is to make a hexagonal nitride semiconductor layer entirely exposed to the outside as described earlier by removing impurities such as a natural oxidation film and moisture by plasma irradiation on the optical resonator facets 113 and 114 immediately before the adhesion layers 115 and 118 are formed. Another effective way is to apply heat treatment to the adhesion layers 115 and 118 after they are formed.

The facet coats 116 and 117 can be formed of a compound containing an element common to the material of which the adhesion layers 115 and 118 laid thereunder are formed. For example, with the adhesion layers 115 and 118 formed of ZnO or the like containing oxygen, an oxide containing Al, Si, Ti, Hf, Nb, Ta, Zr, or the like can be used, and, with the adhesion layers 115 and 118 formed of AlN, GaN, BN, or the like containing nitrogen, an nitride containing Si or the like can be used. When oxygen is a common element as with ZnO and $Al_2O_3$, interdiffusion of Zn and Al occurs in an interfacial several atoms thick layer, leading to the formation of $Zn_xAl_yO$ ($x<1$, $y<1$, $x+y=1$). This provides stronger adhesion between the adhesion layer 115 and the facet coat 116, and between the adhesion layer 118 and the facet coat 117.

The facet coats 116 and 117 may be composed of multiple layers of any of the oxides or nitrides mentioned above. Alternatively, the facet coats 116 and 117 may be composed of multiple layers of Si nitride and Si oxide.

The adhesion layers 115 and 118 are formed anywhere between at least the light output facets of the optical resonator and the facet coats 116 and 117, respectively. Moreover, when the layer thickness of the adhesion layers 115 and 118 is 20 nm or less, no cracks appears, whereby it is possible to fabricate a satisfactory film. Furthermore, the adhesion layers 115 and 118 may be formed by using plasma CVD or magnetron sputtering instead of using ECR sputtering described above. In general, a hexagonal crystal such as ZnO, AlN, GaN, or BN is grown at a high temperature of 400° C. or more by MOCVD. However, by magnetron sputtering or ECR sputtering, such a hexagonal crystal can be grown at ambient temperature, and, by plasma CVD, it can be grown at a temperature of 200° C. or less. Therefore, it is possible to form the adhesion layers 115 and 118 without degradation of the active layer 105.

Next, a case in which the adhesion layer 115 of this embodiment employs hexagonal AlN will be described in detail.

In the nitride semiconductor laser bar 100 having the structure shown in FIG. 1, 6 nm-thick hexagonal Al nitride (AlN) is formed as the adhesion layer 115 on the front optical resonator facet 113 and the back optical resonator facet 114, and 76 nm-thick Al oxide ($Al_2O_3$) is formed as the front facet coat 116.

The adhesion layer 115 and the facet coat 116 contain a common element Al, and therefore interduffision of N and 0 occurs in an interfacial several atoms thick layer between the facet coat 116 and the adhesion layer 115, leading to the formation of $AlN_xO_y$ (x<1, y<1, x+y=1). The formation of $AlN_xO_y$ provides better adhesion between the adhesion layer 115 and the facet coat 116. By the use of reactive sputtering of an Al target, e.g., ECR sputtering, as a method of forming the adhesion layer 115 and the facet coat 116, it is possible to cause a gas to be switched from nitrogen to oxygen. This makes it possible to continuously form the adhesion layer 115 and the facet coat 116 without air exposure thereof without taking the nitride semiconductor laser bar 100 out of the ECR sputtering apparatus. This prevents a natural oxidation film from being formed on the surface of the adhesion layer 115 on which the facet coat 116 has not yet been formed or impurities in the air from being attached thereto, leading to better adhesion between the optical resonator facet 113 and the facet coat 116 even via the adhesion layer 115.

There is a possibility that the adhesion layer 115 with an AlN thickness of 1 nm or less is too thin to provide better adhesion between the facet coat 116 and the optical resonator facet 113. On the other hand, with the adhesion layer 115 with an AlN thickness of 20 nm or more, cracks develop therein or exfoliation thereof occurs due to stress. Therefore, it is preferable that the layer thickness of AlN adhesion layer 115 be 1 nm or more but 20 nm or less. The film thickness of $Al_2O_3$ forming the front facet coat 116 is so set as to give $Al_2O_3$ a refractive index of 5%. Here, the nitride semiconductor laser device emits laser light with an oscillation wavelength λ of about 400 nm. On the other hand, the refractive index n of aluminum oxide is 1.6 and hence λ/4n=62.5 nm. Thus, giving $Al_2O_3$ forming the front facet coat 116 a thickness of about 70 nm makes it possible to realize a low refractive index of 5%. Note that, as described earlier, the back facet coat 117 is a multilayer film composed of eight layers, that is, when a pair of $Al_2O_3/TiO_2$ layers is counted as one period, four periods of them, and the thickness of each layer is set at λ/4n so as to give the multilayer film a refractive index of 95%.

Figure 5:
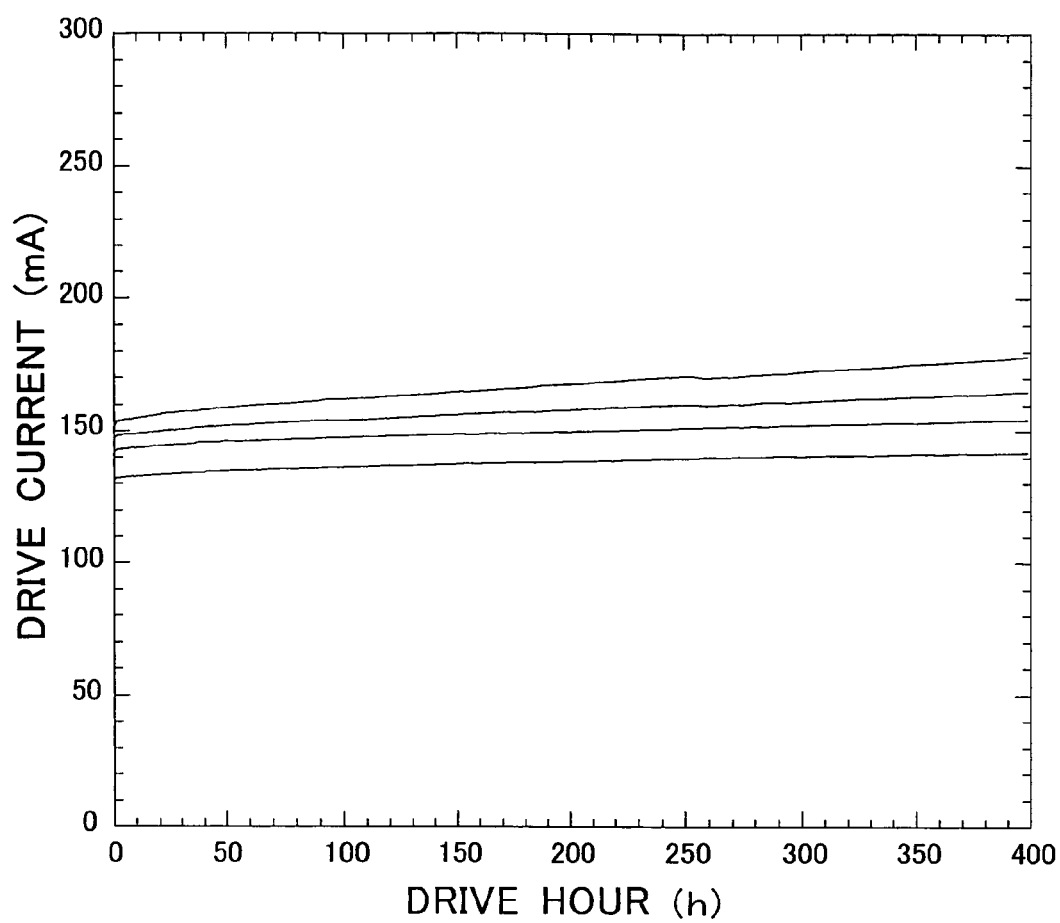
FIG. 5 is a graph showing the results of a life time test of the nitride semiconductor laser device provided with an AlN adhesion layer.

The nitride semiconductor laser bar 100 provided with the adhesion layer 115 of hexagonal AlN was split into individual nitride semiconductor laser devices, and among those actually produced, four devices were subjected to a life time test. The tests were conducted at 70° C. and 100 mW CW (continuous wave). FIG. 5 shows the result of measurement. In these four devices, sudden increase of the drive current due to destructive deterioration of the optical resonator facet (making them permanently unusable) was not observed during the life time test, and the drive current values of these four devices were predicted (based on the rates of increase observed at the 300 hours point and 400 hours point) to take an average of 1984 hours (calculated from the results thus obtained: 1007 hours, 2840 hours, 1470 hours, and 2620 hours) to reach 1.4 times higher than their initial drive current values. These devices exhibited satisfactory properties.

Figure 6:
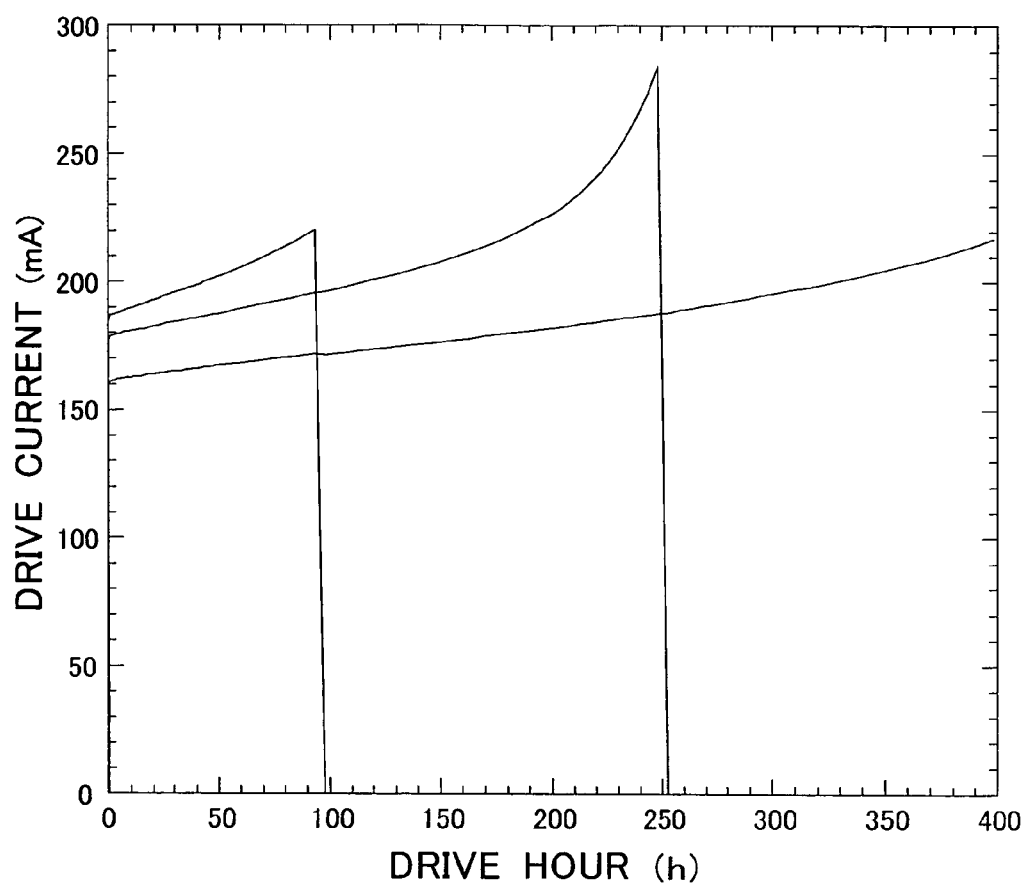
FIG. 6 is a graph showing the results of a life time test of the conventional nitride semiconductor laser device.

On the other hand, FIG. 6 shows the results of a life time test of three nitride semiconductor laser devices provided with a conventional metal layer as an adhesion layer (an adhesion layer: 3 nm-thick Al, a facet coat: 80 nm-thick $Al_2O_3$). The tests were conducted at 70° C. and 100 mW CW. Of those three devices, two became permanently unusable within 300 hours probably due to leak current. The other one, although it had not become permanently unusable within 300 hours, exhibited a higher rate of increase of the drive current than the nitride semiconductor laser of this embodiment, and the drive current value thereof was predicted (based on the rates of increase observed at the 300 hours point and 400 hours point) to take 423 hours to reach 1.4 times higher than its initial drive current value.

As described above, it was confirmed that the nitride semiconductor laser device using AlN as the adhesion layer 115 and $Al_2O_3$ as the facet coat 116 showed significant improvement in the life time test results as compared to the one using the conventional metal layer as the adhesion layer.

This embodiment deals with detailed description of a nitride semiconductor facet formed by cleavage. It should be understood, however, that the present invention is fully applicable to a facet (an etched mirror) formed by vapor phase etching such as RIE (reactive ion etching) ICP, or wet etching using KOH (potassium hydroxide) solution or the like.

The nitride semiconductor light-emitting device of the present invention can be applied to nitride semiconductor laser devices, for example, semiconductor laser devices in which the nitride semiconductor light-emitting device is used singly, hologram laser devices provided further with a hologram device, optoelectronics IC devices in which the nitride semiconductor light-emitting device is integrally packaged with an IC chip for processing for driving or signal detection or the like, or composite optical devices in which the nitride semiconductor light-emitting device is integrally packaged with a waveguide or a micro-optical device. Moreover, the present invention can be applied to a system provided with the devices described above, such as an optical recording system, an optical disk system, or a light source system that operates in an ultraviolet to green light region of spectrum.

What is claimed is:

1. A nitride semiconductor light-emitting device, comprising:
    a nitride-based III-V group compound semiconductor layer formed of a hexagonal crystal; and
    an optical resonator formed in the nitride-based III-V group compound semiconductor layer;
    wherein an adhesion layer of a hexagonal crystal AlN is formed in contact with the nitride-based III-V group compound semiconductor layer forming a facet of the optical resonator, and
    a facet coat is formed on a surface of the adhesion layer.

2. The nitride semiconductor light-emitting device of claim 1,
    wherein the adhesion layer is formed between a light output facet of the optical resonator and the facet coat.

3. The nitride semiconductor light-emitting device of claim 1,
    wherein a layer thickness of the adhesion layer is 20 nm or less.

4. The nitride semiconductor light-emitting device of claim 1,
    wherein the facet coat contains oxide.

5. The nitride semiconductor light-emitting device of claim 4,
wherein the oxide is either in a single layer of oxide of one element selected from the group of Al, Si, Ti, Hf, Nb, Ta, and Zr, or in multiple layers including a layer of oxide of one element selected from the group of Al, Si, Ti, Hf, Nb, Ta, and Zr.

6. The nitride semiconductor light-emitting device of claim 1,
wherein the facet coat is nitride.

7. The nitride semiconductor light-emitting device of claim 1,
wherein the facet coat is composed either of a single layer of Si nitride, or of multiple layers including a layer of Si nitride and a layer of Si oxide.

8. The nitride semiconductor light-emitting device of claim 1,
wherein the facet coat is Al oxide.

9. The nitride semiconductor light-emitting device of claim 1,
wherein the adhesion layer is fabricated by magnetron sputtering, plasma CVD, or ECR sputtering.

10. A method for fabricating a nitride semiconductor light-emitting device, the method comprising the steps of:
forming a nitride-based III-V group compound semiconductor layer formed of a hexagonal crystal;
forming an optical resonator of the nitride-based III-V group compound semiconductor layer by cleaving the nitride-based III-V group compound semiconductor layer;
cleaning a facet of the optical resonator formed by cleavage by using an inert gas;
forming a layer of aluminum nitride of a hexagonal crystal in contact with the nitride-based III-V group compound semiconductor layer forming the cleaned facet of the optical resonator; and
forming a facet coat on a surface of the layer of aluminum nitride.

11. The method for fabricating a nitride semiconductor light-emitting device of claim 10,
wherein the inert gas is a noble gas.

12. The method for fabricating a nitride semiconductor light-emitting device of claim 10,
wherein the inert gas is an Ar gas.

13. The method for fabricating a nitride semiconductor light-emitting device of claim 10,
wherein the inert gas is a nitrogen gas.

* * * * *